(12) United States Patent
Simpson

(10) Patent No.: US 6,362,504 B1
(45) Date of Patent: Mar. 26, 2002

(54) CONTOURED NONVOLATILE MEMORY CELL

(75) Inventor: Mark R. Simpson, White Plains, NY (US)

(73) Assignee: Philips Electronics North America Corporation, New York, NY (US)

(*) Notice: Subject to any disclaimer, the term of this patent is extended or adjusted under 35 U.S.C. 154(b) by 1005 days.

(21) Appl. No.: 08/561,960

(22) Filed: Nov. 22, 1995

(51) Int. Cl.[7] ............................................. H01L 29/788
(52) U.S. Cl. ..................... 257/317; 257/316; 257/321
(58) Field of Search ............................ 257/315, 316, 257/317, 321

(56) References Cited

U.S. PATENT DOCUMENTS

| | | | |
|---|---|---|---|
| 4,698,787 A | 10/1987 | Mukherjee et al. | 365/185.29 |
| 4,763,177 A | 8/1988 | Paterson | 257/315 |
| 4,979,004 A | 12/1990 | Esquivel et al. | 257/316 |
| 5,146,426 A | 9/1992 | Mukherjee et al. | 257/316 |
| 5,172,196 A | * 12/1992 | Matsukawa et al. | 257/316 |
| 5,502,321 A | 3/1996 | Matsushita | 257/316 |
| 5,519,653 A | * 5/1996 | Thomas | 365/185.01 |

FOREIGN PATENT DOCUMENTS

| | | |
|---|---|---|
| DE | 19533165 | 3/1996 |
| JP | 611056 A | 1/1986 |
| JP | 6104451 A | 4/1994 |
| JP | 07130886 A | 5/1995 |

* cited by examiner

*Primary Examiner*—Eddie Lee
*Assistant Examiner*—George C. Eckert, II

(57) ABSTRACT

A nonvolatile memory cell of the type having a single lateral transistor includes source and drain regions separated by a channel region. A floating gate is provided over at least the channel region and is separated therefrom by a gate oxide, with a control gate over the floating gate and insulated therefrom. By having the floating gate extend over substantially its entire length at a substantially constant distance from the surface of the device, and providing the floating gate and the surface with similarly-contoured corners adjacent ends of the source and drain regions alongside the channel region, the nonvolatile memory cell can be programmed and erased using lower voltages than those required by priorart devices.

9 Claims, 1 Drawing Sheet

CONTOURED NONVOLATILE MEMORY CELL

BACKGROUND OF THE INVENTION

The invention is in the field of nonvolatile memory devices, and relates more specifically to a nonvolatile memory cell of the type having a single lateral transistor.

Memory cells having a single lateral transistor, such as EEPROM devices, are generally well known in the art. Several different single-transistor nonvolatile memory cells, as well as memory arrays using such cells, are shown in U.S. Pat. No. 4,698,787, incorporated herein by reference. This patent shows and describes various nonvolatile memory devices of the general type disclosed herein, their construction and method of operation, thus providing a foundation of information for understanding the present invention.

As noted in the above-mentioned reference, an object in designing such memory cells is to create a memory cell design which will require substantially lower programming and erasing voltages. More particularly, programming voltage should be low so that programming speed is fast, and erasing voltage should be low so that the silicon area needed for the circuitry required to generate such voltage is reduced.

As detailed in the cited reference, programming and erasing operations in typical older prior-art devices, such as those shown in FIGS. 1 and 2 of the reference, require either two voltages, one between 8 and 12 volts and a second between 13 and 21 volts, or else a single voltage of approximately 20 volts, depending upon the mechanism used for programming and erasing. Devices made in accordance with the invention disclosed in the reference, by contrast, require that programming voltages be in the range of 10 to 13 volts, with practical present-day devices typically using 12 to 13 volts. In addition, devices of this type typically employ erase voltage levels of about 15 to 25 volts, and it would be desirable for the reasons detailed above to further reduce both the programming and erasing voltage levels.

SUMMARY OF THE INVENTION

It is therefore an object of the present invention to provide a nonvolatile memory cell such as an EEPROM device having a single lateral transistor in which lower programming and erasing voltages than those used in the prior art can be employed.

It is a further object of the invention to provide a nonvolatile memory cell having a relatively fast programming speed and in which the silicon area required for the circuitry necessary to generate the erasing voltage is small.

In accordance with the invention, these objects are achieved by a new nonvolatile memory cell which has a unique configuration in the region of the gate structure that permits the use of lower programming and erasing voltages to achieve a fast and compact device.

The advantageous features of the present invention are achieved in a nonvolatile memory cell of the type having a single lateral transistor in a semiconductor body having a major surface and having source and drain regions separated by a channel region, with an insulated floating gate over the channel region and an insulated control gate over the floating gate. The floating gate extends over substantially its entire length at a substantially constant distance from the major surface of the silicon body, and the floating gate and the major surface are provided with similarly-contoured corners adjacent ends of the source and drain regions which are alongside the channel region.

In a preferred embodiment of the invention, a shallow groove is provided in the major surface of the semiconductor body at the channel region and overlapping the ends of the source and drain regions along the side of the channel region, and the corners of the floating gate and the major surface are concave.

In a further preferred embodiment of the invention, the major surface of the semiconductor body is contoured in a stepwise fashion such that the source region is higher than the drain region, with the corner of the floating gate and the major surface adjacent the source region being concave and the corner of the floating gate and the major surface adjacent the drain region being convex.

In each of the foregoing embodiments, the thickness of the gate oxide between the floating gate and the channel region may advantageously be in the range of about 50 to 200 Angstroms.

BRIEF DESCRIPTION OF THE DRAWING

The invention may be more clearly understood with reference to the following detailed description, to be read in conjunction with the accompanied drawing, in which.

It should be noted that the Figures are not drawn to scale and that various dimensions and proportions may be exaggerated for improved clarity.

DESCRIPTION OF THE PREFERRED EMBODIMENTS

Figure 1:
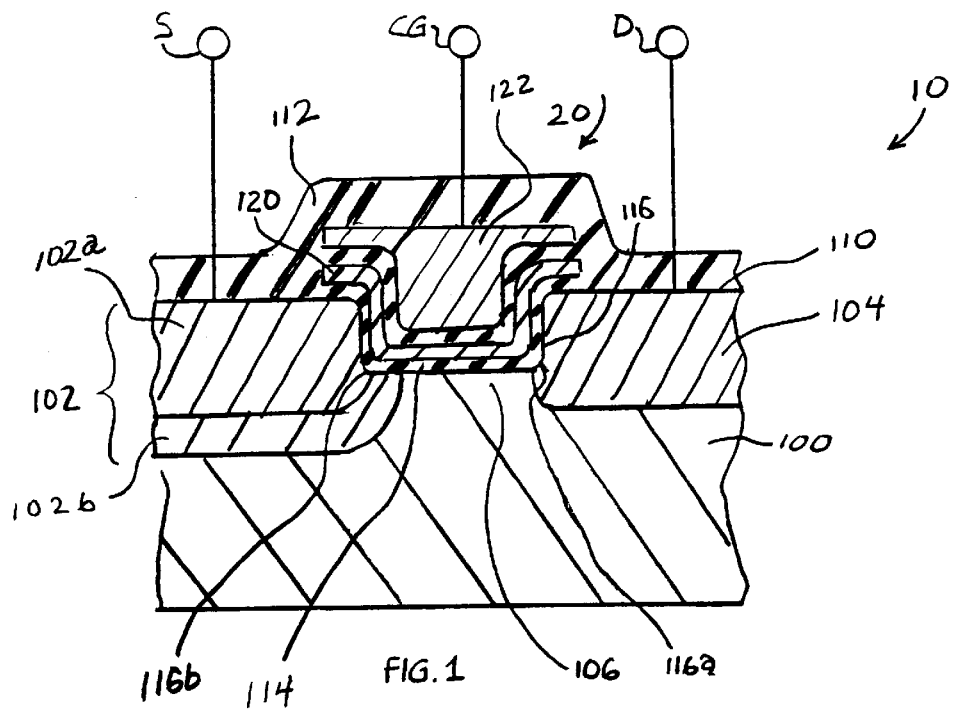
FIG. 1 shows a cross-sectional view of a nonvolatile memory cell in accordance with a first embodiment of the invention.

A nonvolatile memory cell 10 of the type having a single lateral transistor 20 in accordance with a first embodiment of the invention is shown in FIG. 1. The lateral transistor 20 is formed in a semiconductor body 100, in this example a p-type semiconductor body having a doping level of about $3 \times 10^{15}$ atoms/cm$^3$. Semiconductor source and drain regions 102 and 104, respectively, are provided adjoining a major surface 110 of the semiconductor body 100 and are separated by a channel region 106 formed by a surface-adjoining portion of the semiconductor body 100. In this embodiment, the drain region 104 is formed of highly-doped n-type material having a doping level of about $1 \times 10^{20}$ atoms/cm$^3$., while the source region 102 is composed of a first source region portion 102a having approximately the same doping level as that of the drain region and a lightly-doped n-type second source region portion 102b located beneath the first portion 102a and serving as a transitional region between the first source region portion 102a and the substrate 100. The doping level of the lightly-doped second source region portion 102b is selected to optimize the electrical erase function and to prevent breakdown, and will be typically in the range of about $5 \times 10^{17}$ atoms/cm$^3$.

The major surface 110 of the device is covered with an insulating layer 112, such as a low temperature oxide (LTO), with a portion of the device over the channel 106 being covered by a thin gate oxide 114, provided in a shallow groove 116 located above the channel region 106. The groove 116 is provided with lower corners 116a and 116b located adjacent the drain and source regions, respectively.

A floating gate 120 is provided over the channel region 106 and ends of the source and drain regions 102, 104 alongside the channel region, with the floating gate extending over substantially its entire length at a substantially constant distance from the major surface 110. It will be recognized that the distance between the floating gate 120 and the major surface 110 will remain only substantially constant, rather than be precisely the same, since the nature of the manufacturing processing will result in the distance between the floating gate and the major surface being somewhat reduced at the areas of the corners resulting from the formation of groove 116, a phenomenon which will serve to improve device performance by permitting erasing operations to be conducted at lower voltage levels, as further described below.

The physical structure of the device is completely by the provision of a control gate 122 over the floating gate 120, with the facing surfaces of the two gates having parallel contours separated by a thin intergate dielectric portion of insulating layer 112. Typically, both the control gate and the floating gate are fabricated of polysilicon.

For simplicity, electrical connections to the source, control gate and drain regions are shown symbolically by connection lines S, CG and D.

Figure 2:
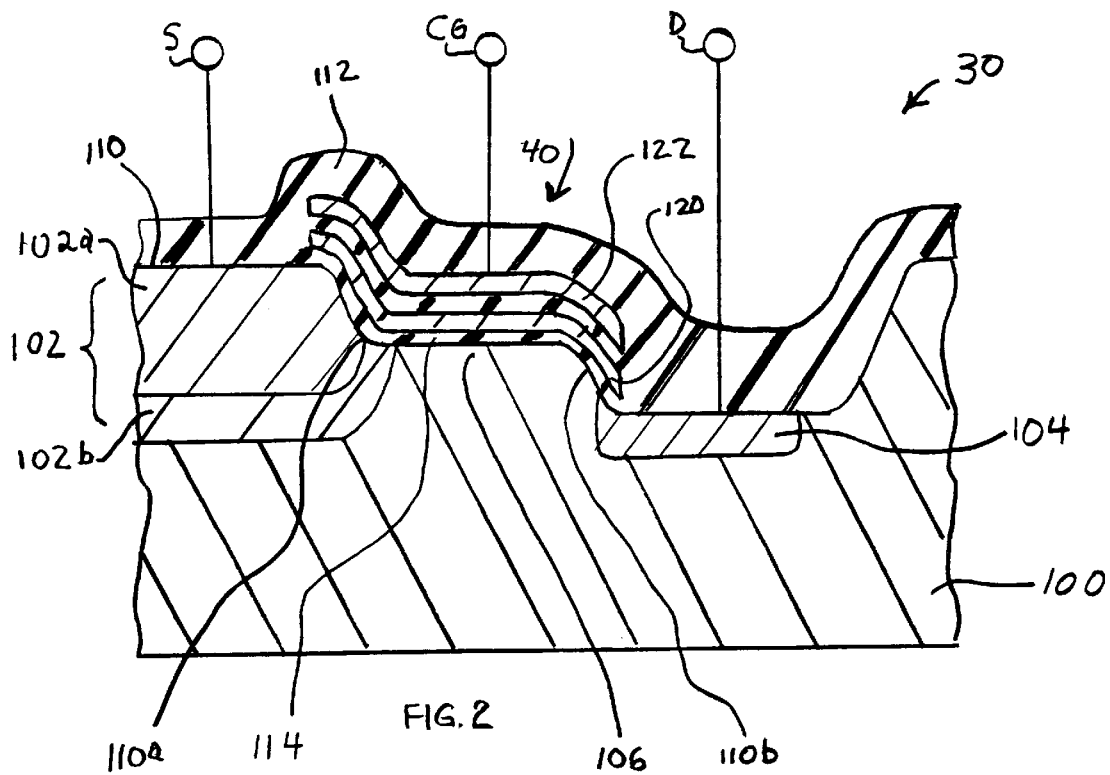
FIG. 2 shows a cross-sectional view of a nonvolatile memory cell in accordance with a second embodiment of the invention.

A second embodiment of a nonvolatile memory cell 30 in accordance with the invention is shown in FIG. 2. In this figure, like reference numerals are used to designate like portions of the device, and regions, doping concentrations and the like which are similar to those described above in connection with FIG. 1 are not further described here.

The single lateral transistor 40 shown in FIG. 2 differs from the transistor 20 shown in FIG. 1 primarily in that the major surface 110 is differently contoured. Instead of having a shallow groove 116 with concave corners 116a and 116b as shown in FIG. 1, the major surface 110 of lateral transistor 40 in FIG. 2 is contoured in a stepwise fashion such that the source region 102 is higher than the drain region 104. As a result of this stepwise contouring, the major surface 110 has a first concave corner 110a adjacent the source region 102 and a second convex corner 110b adjacent the drain region 104. As in the previously-discussed embodiment of FIG. 1, floating gate electrode 120 extends over substantially its entire length at a substantially constant distance from major surface 110, and the floating gate and major surface have similarlycontoured corners at locations 110a and 110b adjacent ends of the source and drain regions 102, 104 alongside the channel region 106. Again, the floating gate will extend over the gate oxide 114 at a substantially constant distance from the major surface 110, although, due to characteristics inherent in the manufacturing process, the gate oxide will tend to be somewhat thinner at the corner areas, a phenomenon which will enhance operation of the device in a manner to be discussed below.

The devices described above may be manufactured using standard integrated circuit fabricating techniques. Specifically, various known techniques may be used to form the grooved or contoured regions of the major surface, including reactive ion etching (RIE), local oxidation of silicon (LOCOS) or a combination of these two techniques.

As is well known in this art, programming and erasing operations in nonvolatile memory devices such as EEPROM devices may be carried out using hot electron injection, also known as Channel Hot Electron (CHE) injection, or Fowler Nordhiem (FN) tunneling. These mechanisms are described, for example, in the previously-discussed U.S. Pat. No. 4,698,787, and also in U.S. Pat. No. 5,146,426, incorporated herein by reference. This latter patent discloses a vertical single-cell deep trench device in which trench corners are provided only at the buried source, and in which the channel region and the corner area of the trench are deliberately separated to enhance cell endurance. This reference teaches that it is advantageous to provide the gate dielectric with a localized portion of deliberately reduced thickness at a location away from the channel region. Furthermore, and referring specifically to lateral single-cell devices such as those shown in U.S. Pat. No. 4,698,787, it was noted that the techniques described in U.S. Pat. No. 5,146,426 would not be applicable to lateral devices since these techniques would result in manufacturability problems in terms of yield and reproducibility.

Since programming and erasing by CHE injection and FN tunneling are well known, these techniques will not be described further here. With respect to these programming and erasing operations, the key points to note in connection with the present invention are that, in general, these mechanisms require the application of a voltage across a relatively thin oxide, and that a tradeoff exists in that thin oxide layers are desirable to reduce the required programming and erasing voltages, but may be more subject to breakdown, and thus negatively effect device robustness and reliability. Furthermore, the FN tunneling mode permits the use of lower voltages than the CHE injection mode, but requires commensurately thinner dielectric layers, thus decreasing reliability.

In the present invention, reduced programming and erasing voltages can be employed in either the CHE injection mode or the FN tunneling mode due to the unique surface configuration of the device adjacent ends of the source and drain region along side the channel region. By providing concave or convex corners (116a,b, 110a,b) at these locations, programming and erasing operations can be conducted at lower voltages than would otherwise be possible in a robust and reliable device. This is believed to be possible because providing contoured corners at the indicated areas provides a two-fold operational enhancement. First, the contoured corner regions provide a localized higher electric field at the contoured areas, thus permitting tunneling or injection to occur at a lower voltage than would otherwise be possible. Second, the particular shape (i.e., concave or convex) of the contour serves to enhance the flow of electrons in the desired direction and at the desired location within the device to further optimize the programming and erasing functions. Furthermore, the invention permits achieving these advantages without deliberate thinning of the gate dielectric or separating the trench corner from the source region to enhance cell endurance as in U.S. Pat. No. 5,146,426.

For devices employing the FN tunneling mode, thinner gate oxide layers and lower voltages may be employed than when CHE injection is used. In the present invention, for example, the thickness of the gate oxide 114 may be in the range of 50 to 100 Angstroms in devices intended for operation in the FN tunneling mode and 100 to 200 Angstroms for devices intended for operation in the CHE injection mode. As compared to priorart single lateral-transistor devices of the type shown in U.S. Pat. No. 4,698,787, lateral transistor devices having a contoured major surface and floating gate in accordance with the invention are believed to be capable of operating with programming and erasing voltages which are about 20 to 25% lower than those required in otherwise-comparable prior art devices. Furthermore, by using the configuration shown in FIG. 2 in conjunction with a gate oxide thickness in the range of 50 to 100 Angstroms, programming and erasing can both be accomplished by FN tunneling, and it is anticipated that such a device could employ voltages as low as about 3 volts for both programming and erasing, thereby constituting a substantial improvement over presently-available devices.

Thus, the present invention provides a nonvolatile memory cell of the type having a single lateral transistor which has a unique configuration in the region of the gate structure that permits the use of lower programming and erasing voltages to achieve a fast and compact device.

While the invention has been particularly shown and described with reference to several preferred embodiments thereof, it will be understood by those skilled in the art that various changes in form and detail may be made without departing from the spirit and scope of the invention.

I claim:

1. A nonvolatile memory cell of the type having a single lateral transistor in a semiconductor body having a major surface comprising semiconductor source and drain regions of a first conductivity type adjoining said major surface and separated by a channel region of a second conductivity type opposite that of the first conductivity type and adjoining said major surface, a floating gate over at least said channel region and portions of said source and drain regions and separated therefrom by a gate oxide on said major surface, and a control gate over said floating gate and insulated therefrom, wherein said floating gate is separated from said major surface by a substantially constant distance over substantially the entire length of said floating gate, and corners of said floating gate and said major surface have substantially conforming contours adjacent ends of said source and drain regions alongside said channel region.

2. A nonvolatile memory cell as in claim 1, wherein a shallow groove is provided in said major surface at said channel region and overlapping said ends of the source and drain regions, and the corners of said floating gate and said major surface are concave.

3. A nonvolatile memory cell as in claim 2, wherein the thickness of said gate oxide is in the range of about 50–200 Å.

4. A nonvolatile memory cell as in claim 3, wherein the thickness of said gate oxide is in the range of about 50–100 Å.

5. A nonvolatile memory cell as in claim 3, wherein the thickness of said gate oxide is in the range of about 100–200 Å.

6. A nonvolatile memory cell as in claim 1, wherein said major surface is contoured in a stepwise fashion such that said source region is higher than said drain region, a first corner of said floating gate and said major surface adjacent said source region being concave and a second corner of said floating gate and said major surface adjacent said drain region being convex.

7. A nonvolatile memory cell as in claim 6, wherein the thickness of said gate oxide is in the range of about 50–200 Å.

8. A nonvolatile memory cell as in claim 7, wherein the thickness of said gate oxide is in the range of about 50–100 Å.

9. A nonvolatile memory cell as in claim 7, wherein the thickness of said gate oxide is in the range of about 100–200 Å.

* * * * *